United States Patent
Cernea et al.

(10) Patent No.: US 7,471,575 B2
(45) Date of Patent: Dec. 30, 2008

(54) NON-VOLATILE MEMORY AND METHOD WITH SHARED PROCESSING FOR AN AGGREGATE OF READ/WRITE CIRCUITS

(75) Inventors: Raul-Adrian Cernea, Santa Clara, CA (US); Yan Li, Milpitas, CA (US); Shahzad Khalid, Union City, CA (US); Siu Lung Chan, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/781,917

(22) Filed: Jul. 23, 2007

(65) Prior Publication Data

US 2007/0263450 A1     Nov. 15, 2007

Related U.S. Application Data

(63) Continuation of application No. 11/026,536, filed on Dec. 29, 2004, now abandoned.

(51) Int. Cl.
    *G11C 7/10* (2006.01)
(52) U.S. Cl. .............. 365/189.05; 365/189.18; 365/189.19
(58) Field of Classification Search ............ 365/189.05, 365/189.18, 189.19
    See application file for complete search history.

(56) References Cited

U.S. PATENT DOCUMENTS

| | | |
|---|---|---|
| 4,357,685 A | 11/1982 | Daniele et al. |
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,418,752 A | 5/1995 | Harari et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Huan Hoang
*Assistant Examiner*—Kretelia Graham
(74) *Attorney, Agent, or Firm*—Davis Wright Tremaine LLP

(57) ABSTRACT

A non-volatile memory device capable of reading and writing a large number of memory cells with multiple read/write circuits in parallel has an architecture that reduces redundancy in the multiple read/write circuits to a minimum. The multiple read/write circuits are organized into a bank of similar stacks of components. Redundant circuits such as a processor for processing data among stacks each associated with multiple memory cells are factored out. The processor is implemented with an input logic, a latch and an output logic. The input logic can transform the data received from either the sense amplifier or the data latches. The output logic further processes the transformed data to send to either the sense amplifier or the data latches or to a controller. This provides an infrastructure with maximum versatility and a minimum of components for sophisticated processing of the data sensed and the data to be input or output.

18 Claims, 21 Drawing Sheets

U.S. PATENT DOCUMENTS

| | | | |
|---|---|---|---|
| 5,774,397 | A | 6/1998 | Endoh et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,307,800 | B1 * | 10/2001 | Derner ........................ 365/220 |
| 6,396,736 | B1 * | 5/2002 | Jyouno et al. ........... 365/185.03 |
| 2004/0060031 | A1 | 3/2004 | Cernea |
| 2004/0109357 | A1 | 6/2004 | Cernea et al. |

OTHER PUBLICATIONS

USPTO, "Office Action," mailed in related U.S. Appl. No. 11/026,536 on Apr. 24, 2006, 13 pages.

USPTO, "Office Action," mailed in related U.S. Appl. No. 11/026,536 on Oct. 20, 2006, 12 pages.

USPTO, "Office Action," mailed in related U.S. Appl. No. 11/026,536 on Apr. 23, 2007, 13 pages.

* cited by examiner

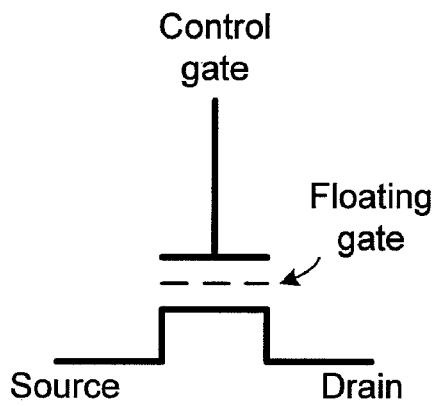
FIG. 1A      *(Prior Art)*
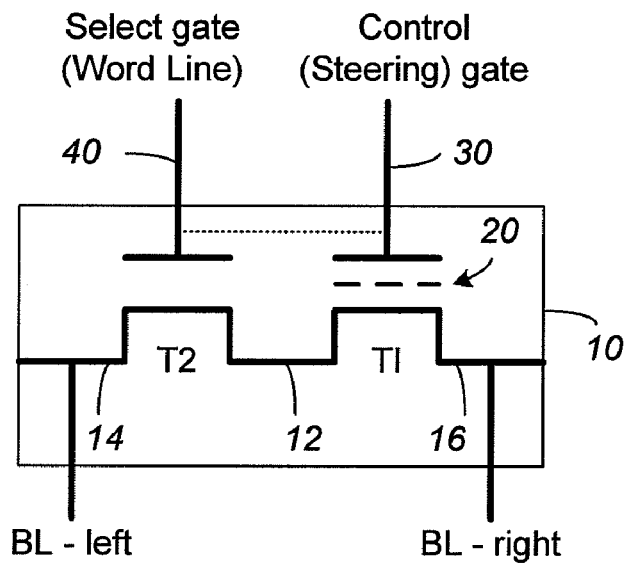
FIG. 1B      *(Prior Art)*

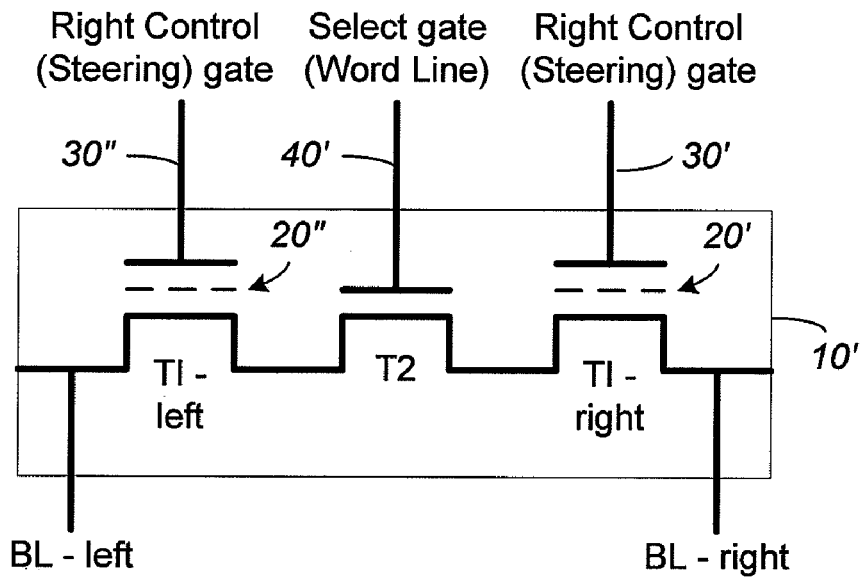
FIG. 1C *(Prior Art)*
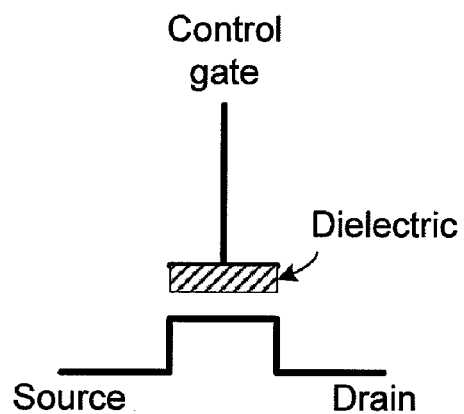
FIG. 1E *(Prior Art)*

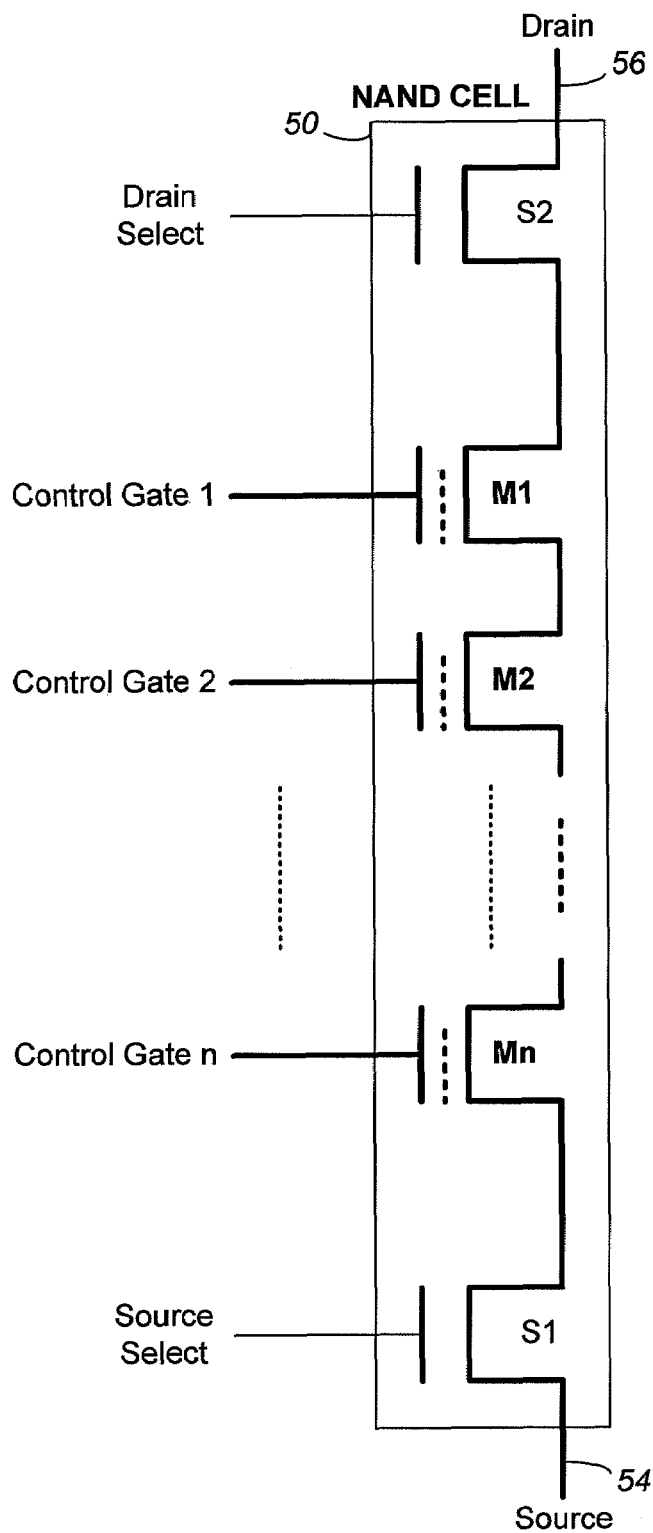
FIG. 1D *(Prior Art)*

FIG. 4  *(Prior Art)*

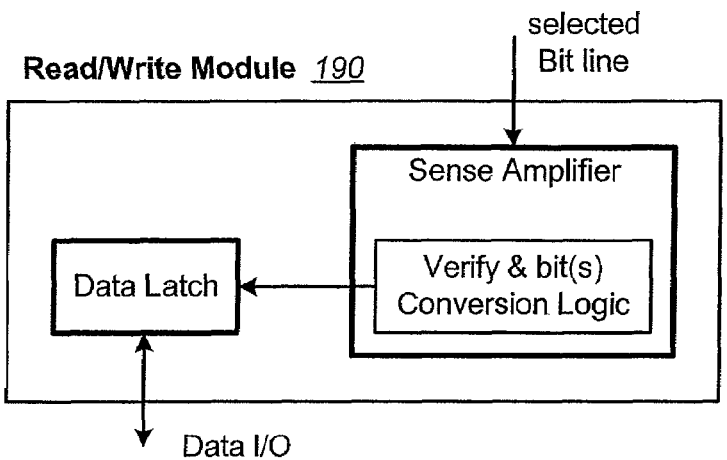
FIG. 6A *(Prior Art)*
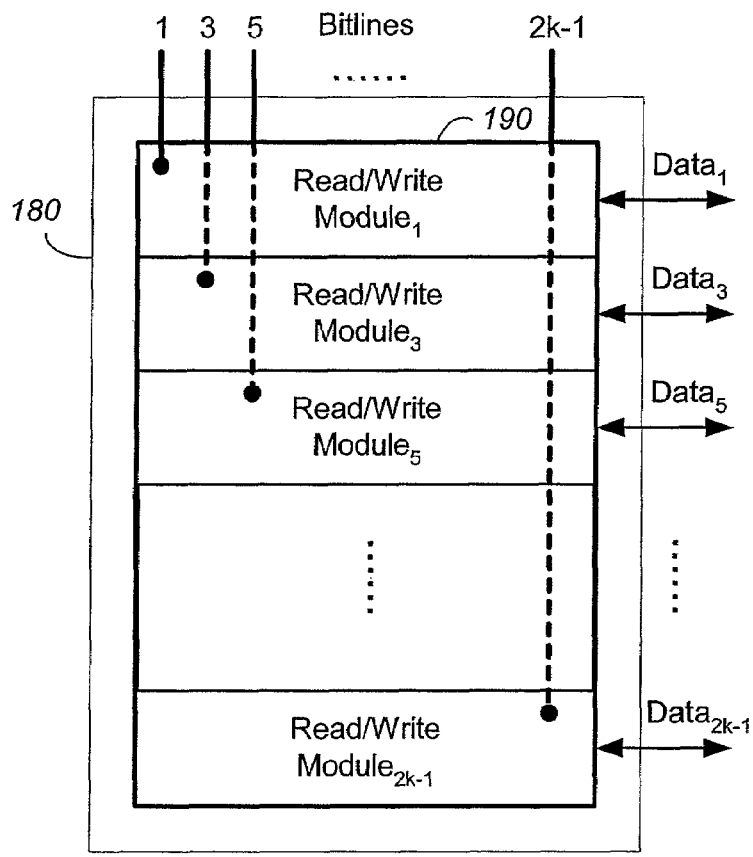
FIG. 6B *(Prior Art)*

INPUT LOGIC TRUTH TABLE

| Transfer Mode | ONE | ONEB<0> | ONEB<1> | PBUS (Input) | BSI (Output) |
|---|---|---|---|---|---|
| PASS-THROUGH | 1 | 0 | 0 | PBUS | PBUS |
| INVERT | 0 | 1 | 1 | PBUS | PBUS* |
| FLOAT | 1 | 1 | 0 | PBUS | FLOAT |

OUTPUT LOGIC TRUTH TABLE

| Transfer Mode | PINV | NINV | PDIR | NDIR | MTCH | PBUS (Output) |
|---|---|---|---|---|---|---|
| PASS-THROUGH | D | D | D | 1 | 0 | 0 |
|  | 0 | D | D | D | 1 | 1 |
| INVERT | D | D | 0 | D | 0 | 1 |
|  | D | 1 | D | D | 1 | 0 |
| FLOAT | D | D | D | D | X | Z |
| PRE-CHARGE | 0 | D | 0 | D | X | 1 |

(Default values: PINV=1, NINV=0, PDIR=1, NDIR=0)

OPERATIONS OF COMMON PROCESSOR
(Steps can be skipped depending on the operation)

PROGRAM INHIBIT (2- bit program)

TRANSFER DATA FROM SENSE AMPLIFIER TO DATA LATCHES BY THE COMMON PROCESSOR

NON-VOLATILE MEMORY AND METHOD WITH SHARED PROCESSING FOR AN AGGREGATE OF READ/WRITE CIRCUITS

CROSS REFERENCE TO RELATED APPLICATIONS

This application is a continuation of application Ser. No. 11/026,536, filed on Dec. 29, 2004, which applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones having an aggregate of highly compact and high performance read/write circuits sharing a common processor.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10' is similar to that of FIG. 1B except it effectively has three transistors in series. In this type of cell, two storage elements (i.e., that of T1-left and T1-right) are included over its channel between source and drain diffusions with a select transistor T2 in between them. The memory transistors have floating gates 20' and 20", and control gates 30' and 30", respectively. The select transistor T2 is controlled by a select gate 40'. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effectively created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIGS. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 32 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

U.S. Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

According to one aspect of the invention, a processor for processing data between a plurality of sense amplifiers and data latches comprises an input logic, a latch and an output logic. The input logic can transform the data received from either the sense amplifier or the data latches. The output logic further processes the transformed data to send to either the sense amplifier or the data latches or to a controller. This provides an infrastructure with maximum versatility and a minimum of components for sophisticated processing of the data sensed and the data to be input or output.

The saving in space by the various aspects of the present invention allows for a more compact chip design. The saving in circuits and therefore in space and power consumption can amount to as much as fifty percent as compared to existing read/write circuits. In particular, the read/write modules can be densely packed so that they can simultaneously serve a contiguous row of memory cells of the memory array.

Additional features and advantages of the present invention will be understood from the following description of its preferred embodiments, which description should be taken in conjunction with the accompanying drawings.

BRIEF DESCRIPTION OF THE DRAWINGS

FIGS. 1A-1E illustrate schematically different examples of non-volatile memory cells.

FIG. 6A is a schematic block diagram of an individual read/write module.

FIG. 6B shows the read/write stack of FIG. 5 implemented conventionally by a stack of read/write modules.

DETAILED DESCRIPTION OF THE PREFERRED EMBODIMENTS

Figure 2:
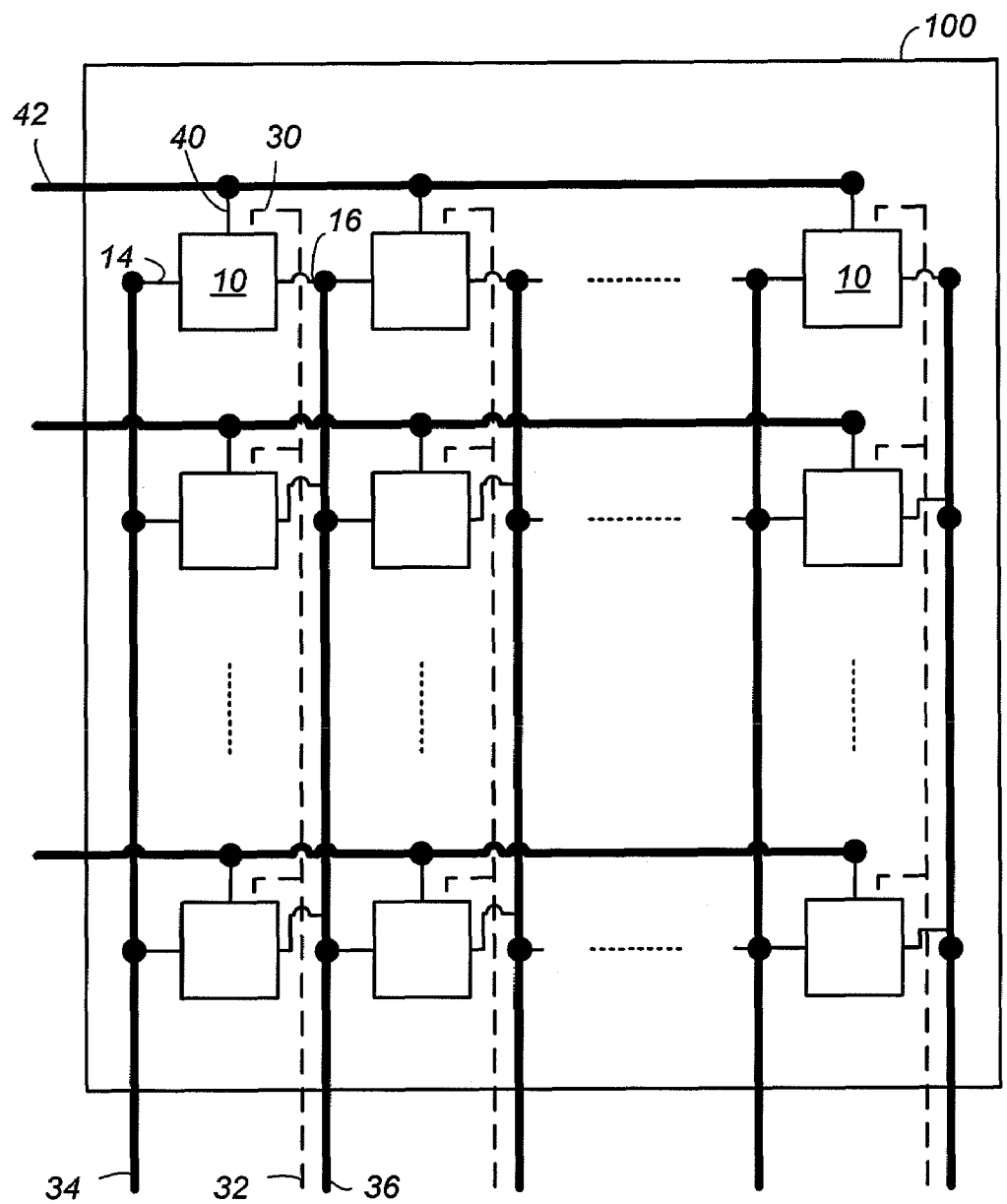
FIG. 2 illustrates an example of an NOR array of memory cells.
Figure 3:
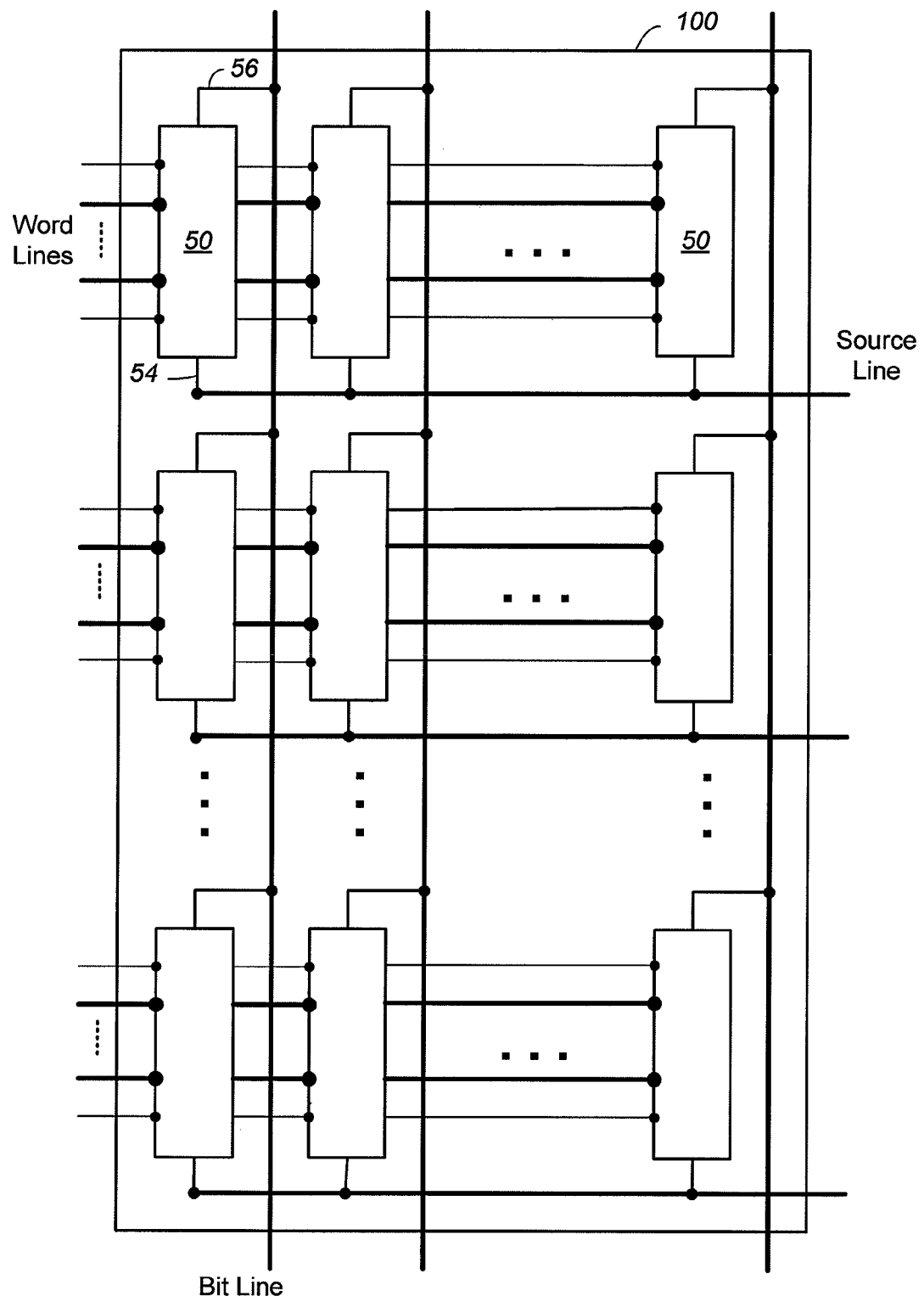
FIG. 3 illustrates an example of an NAND array of memory cells, such as that shown in FIG. 1D.
Figure 4:
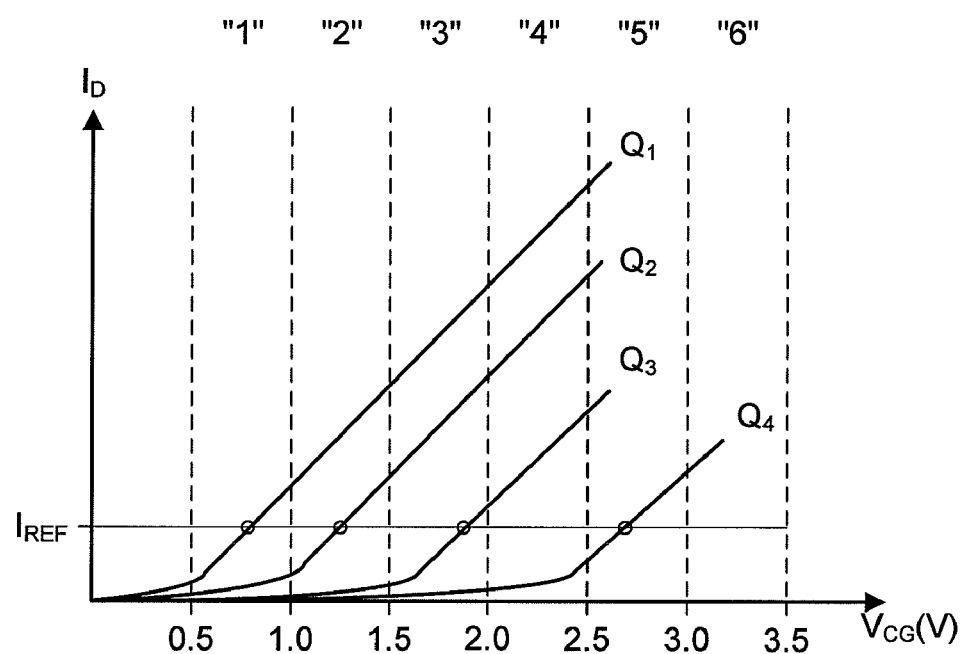
FIG. 4 illustrates the relation between the source-drain current and the control gate voltage for four different charges Q1-Q4 that the floating gate may be storing at any one time.
Figure 5:
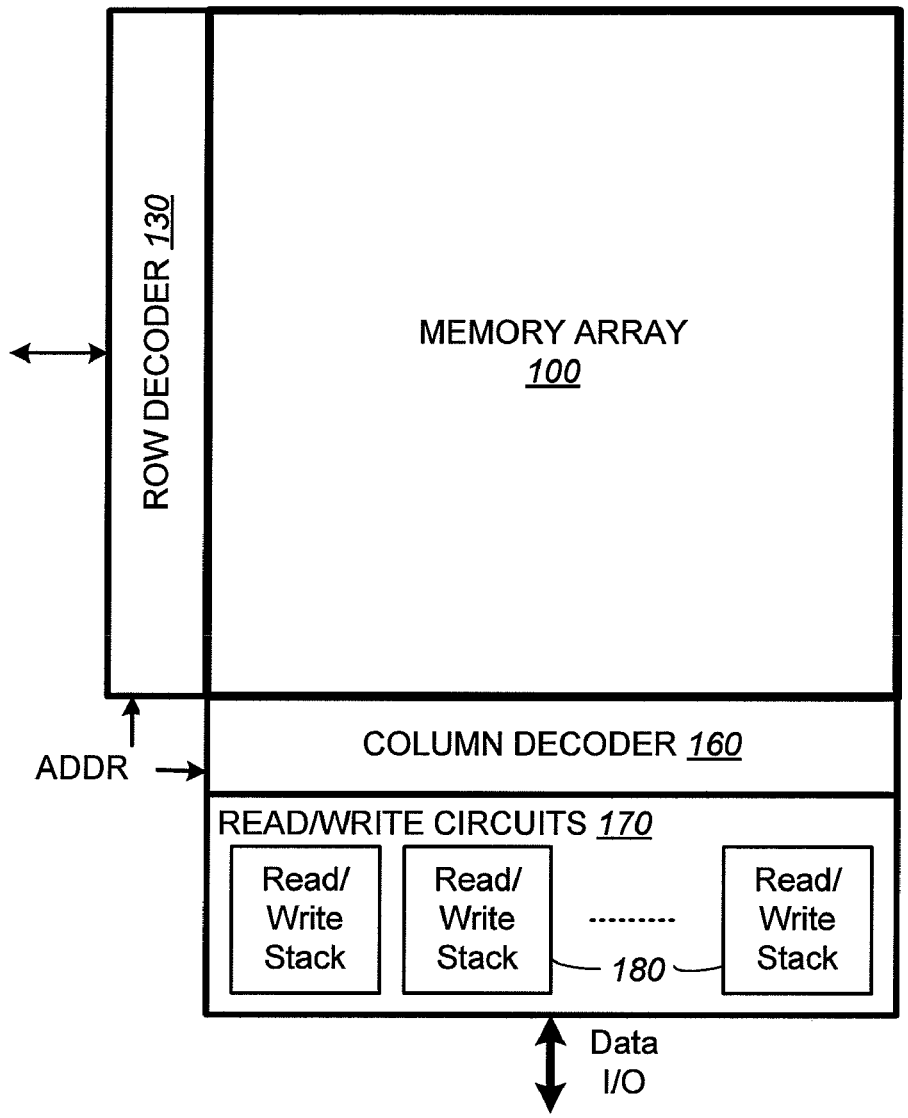
FIG. 5 illustrates schematically a typical arrangement of a memory array accessible by read/write circuits via row and column decoders.
Figure 7A:
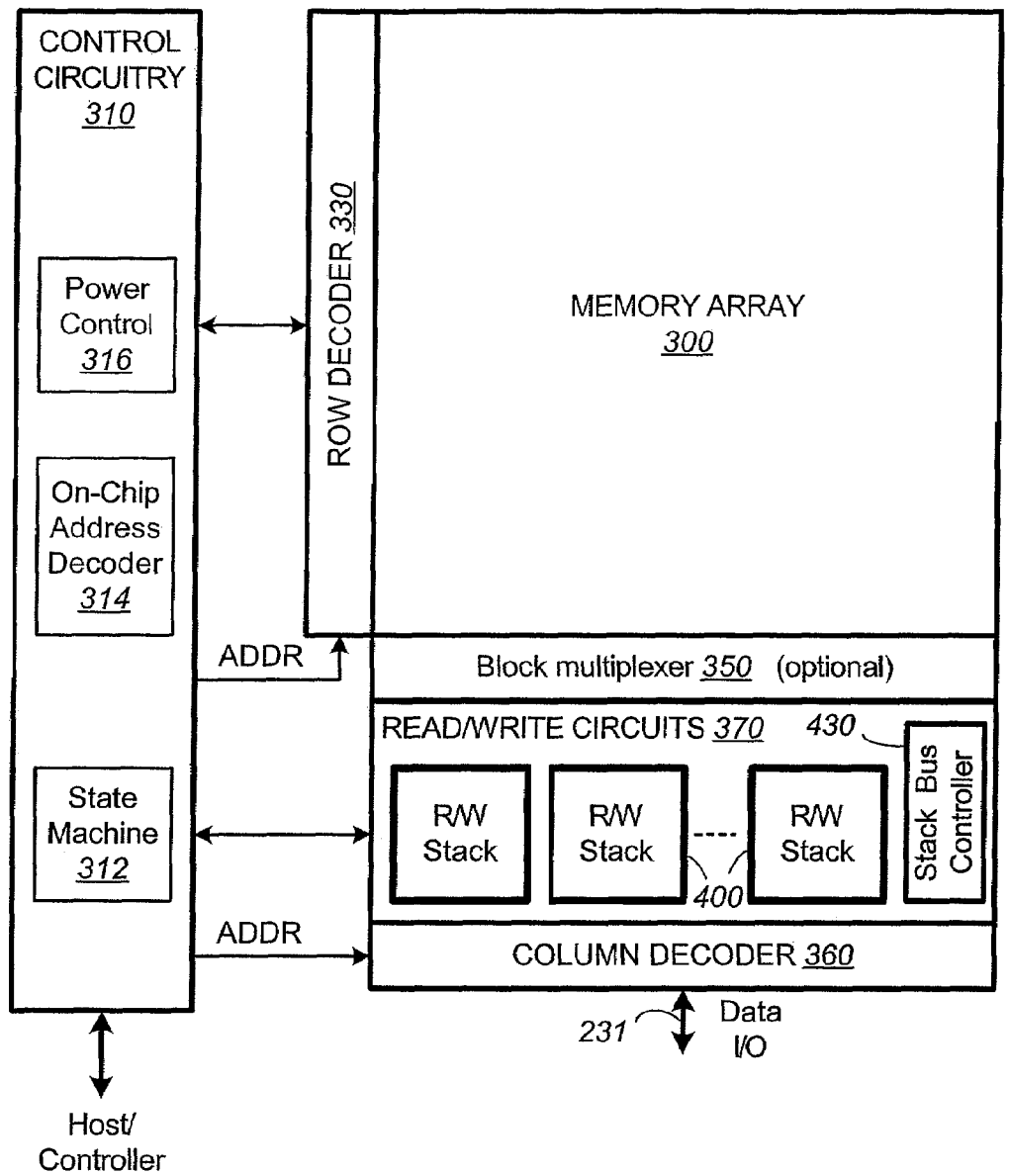
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

Figure 7B:
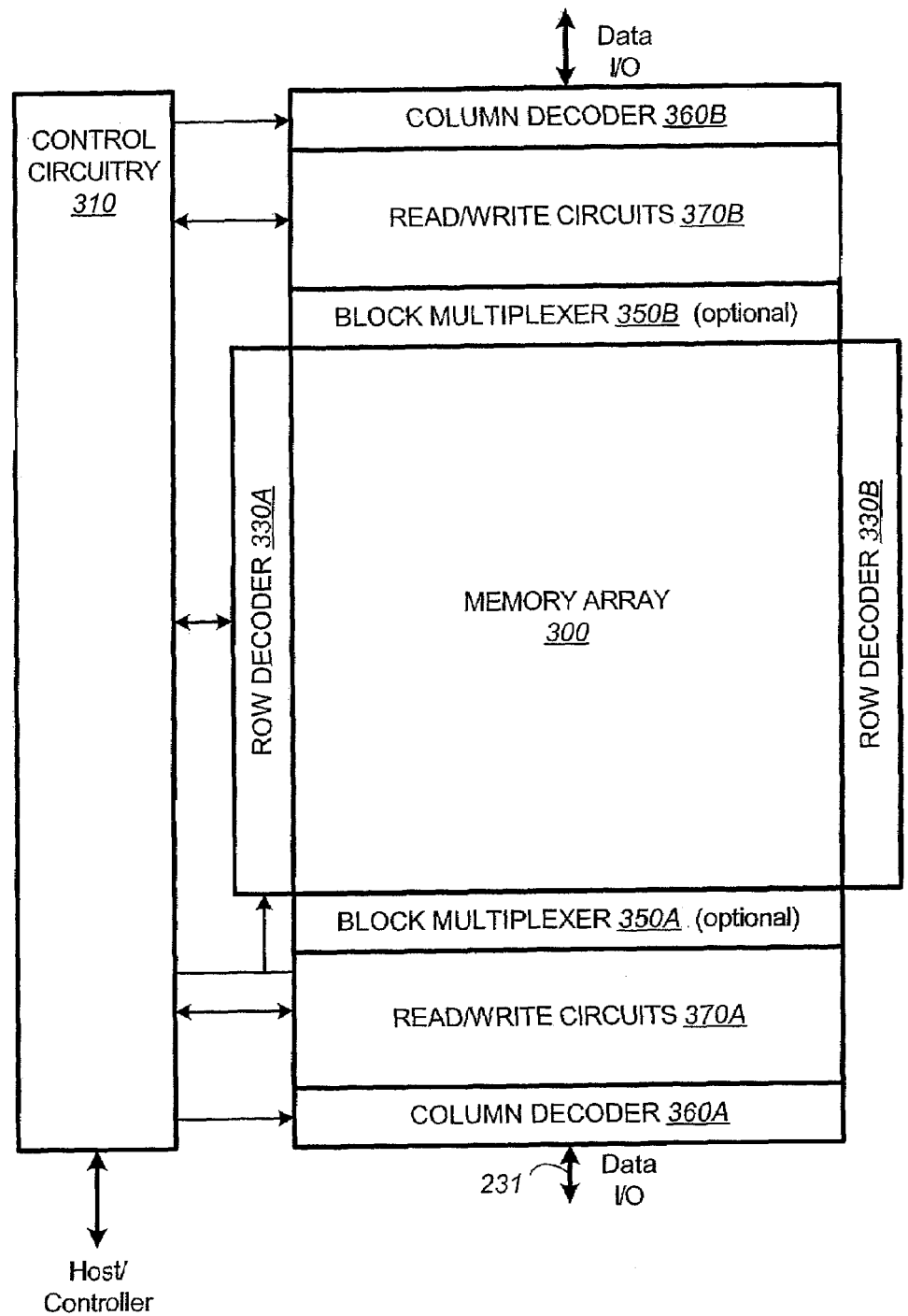
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
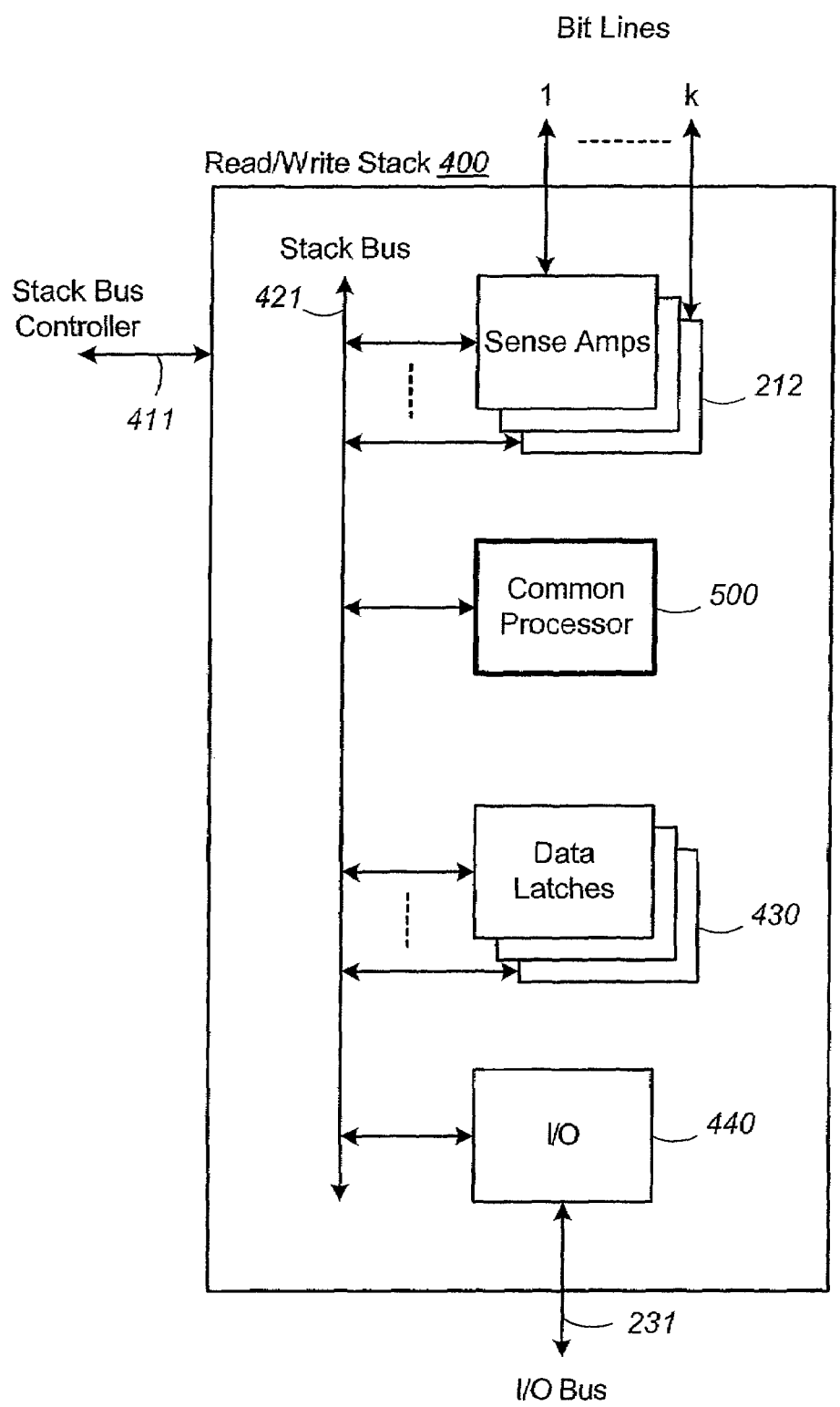
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
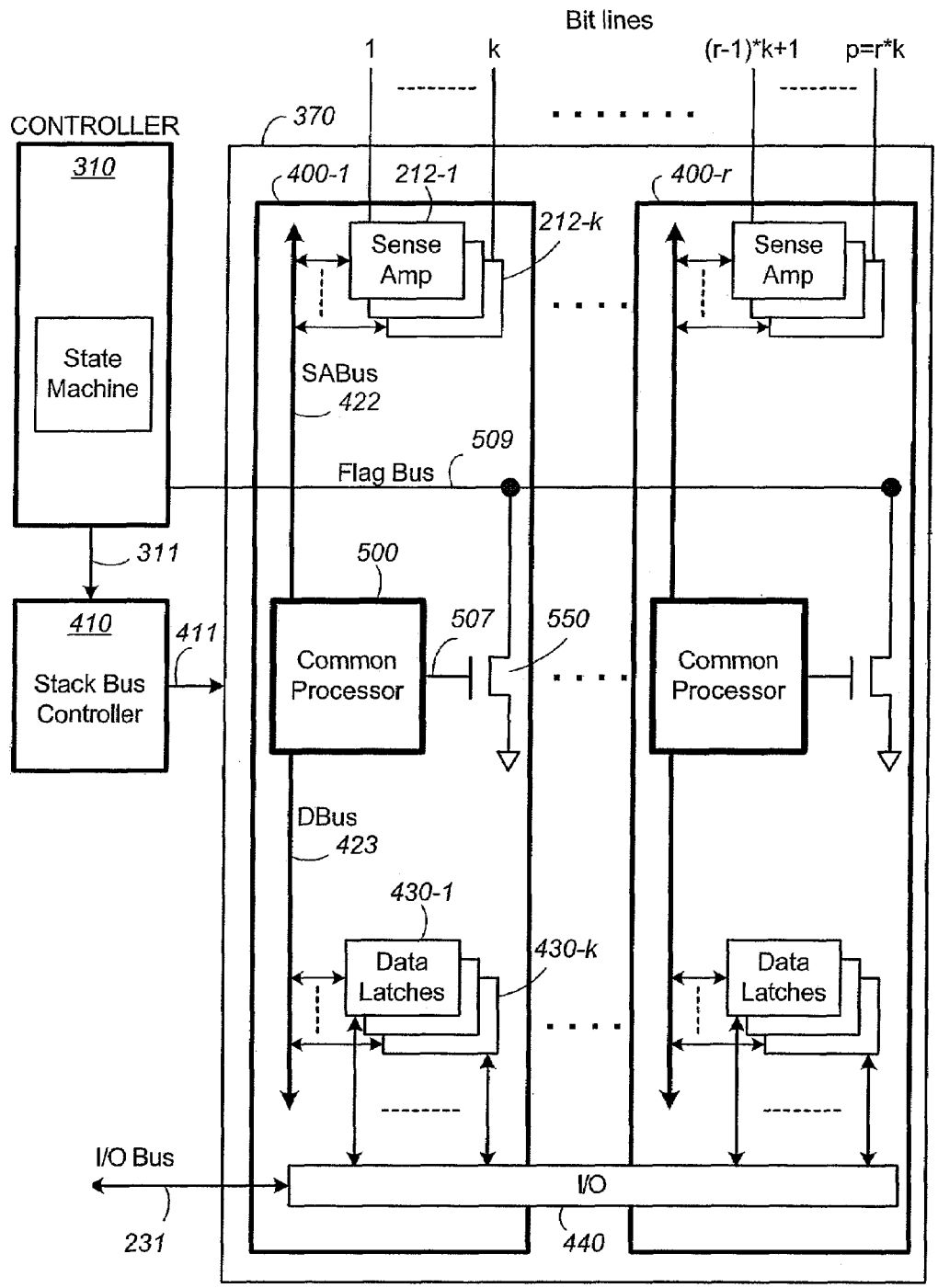
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, ..., 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p =r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in U.S. Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 422, 423 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
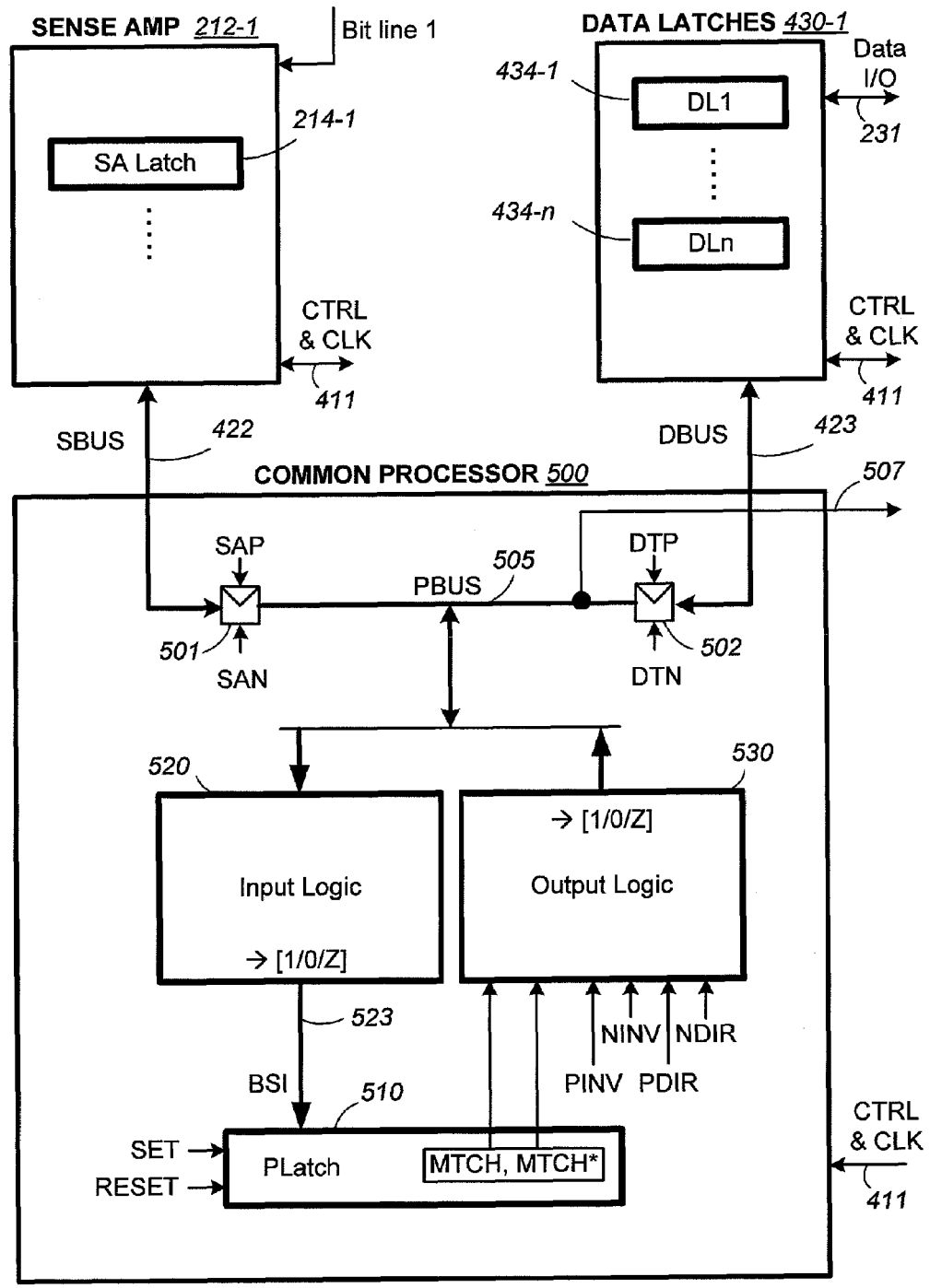
FIG. 10 illustrates an improved embodiment of the common processor shown in FIG 9.

FIG. 10 illustrates an improved embodiment of the common processor shown in FIG 9. The common processor 500 comprises a processor bus, PBUS 505 for communication with external circuits, an input logic 520, a processor latch PLatch 510 and an output logic 530.

The input logic 520 receives data from the PBUS and outputs to a BSI node as a transformed data in one of logical states "1", "0", or "Z" (float) depending on the control signals from the stack bus controller 410 via signal lines 411. A Set/Reset latch, PLatch 510 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals (illustrated explicitly as PINV, NINV, PDIR and NDIR) from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, ..., 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
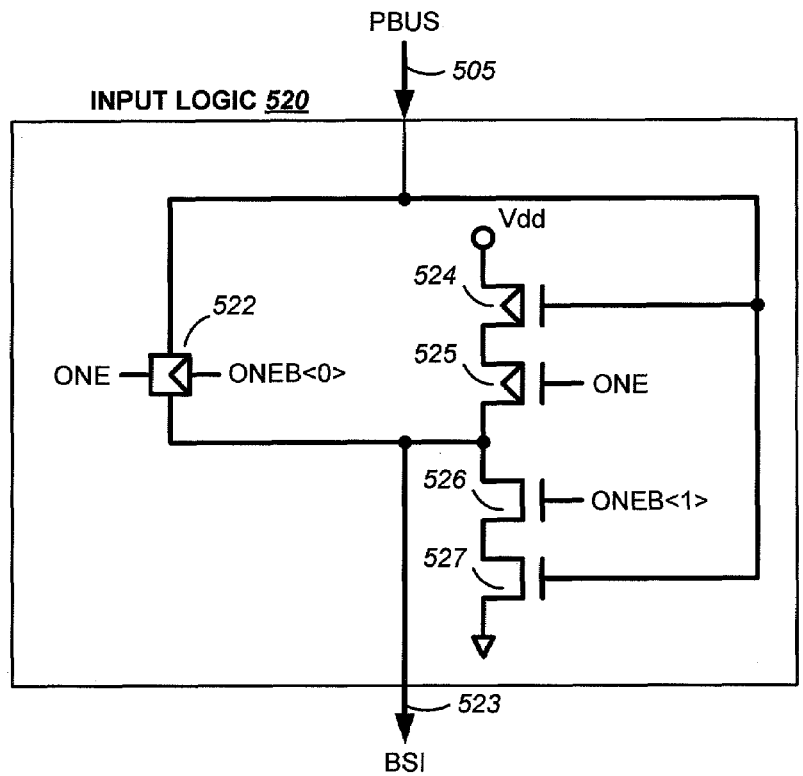
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
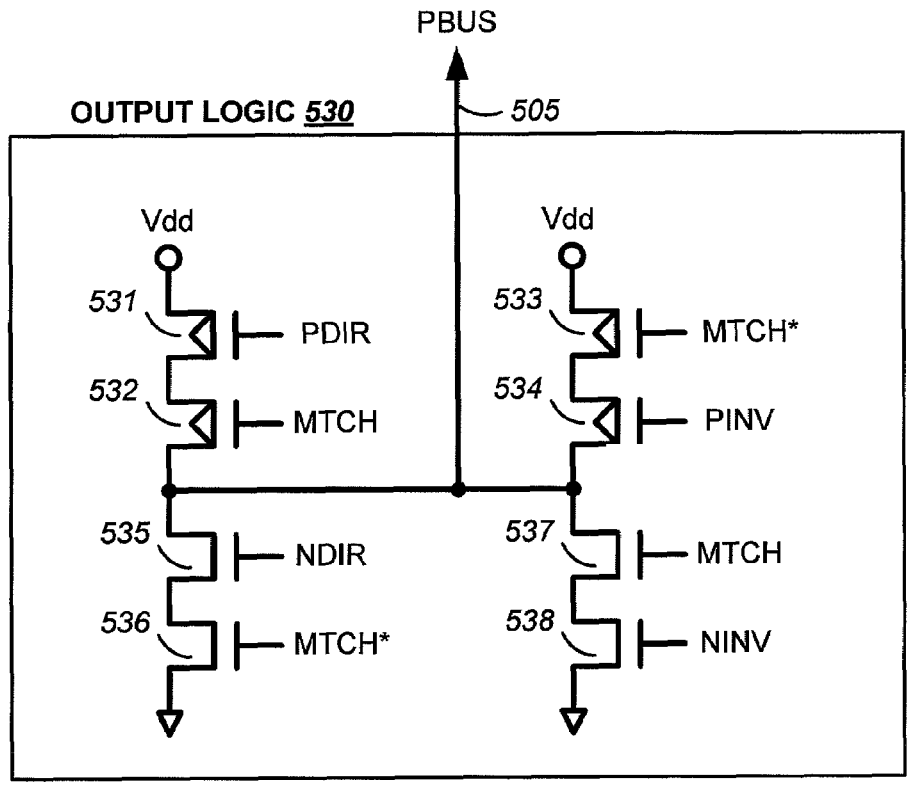
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 510. The output logic 530 receives the data MTCH and MTCH* from the output of PLatch 510 and depending on the control signals; outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to and is able to pull up the PBUS when MTCH is at "1". Similarly, a first pull-down circuit comprises n-transistors 535 and 536 in series to ground, and is able to pull down the PBUS when MTCH is at "0". A second pull-up circuit comprises n-transistors 537 and 538 in series to ground and is able to pull down the PBUS when MTCH is at "1".

One feature of the invention is to constitute the pull-up circuits with PMOS transistors and the pull-down circuits with NMOS transistors. Since the pull by the NMOS is much stronger the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common Processor Operations

When the common processor 500 is configured as described, it is able to perform versatile data operation with respect to the sense amplifier and the data latches.

Figure 13:
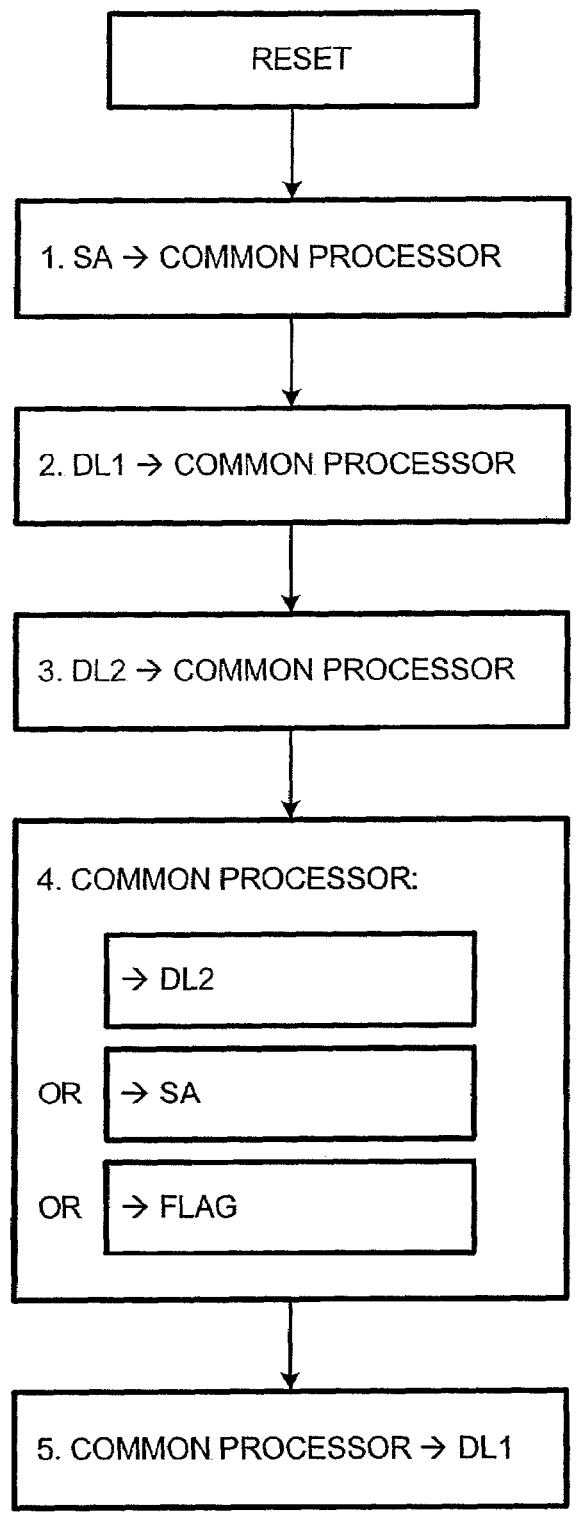
FIG. 13 illustrates the basic functional steps in the operation of the common processor shown in FIG. 10.

FIG. 13 illustrates the basic functional steps in the operation of the common processor shown in FIG. 10. To be more specific, the data latches contains at least two latches, DL1 (or Lower Data Latch) and DL2 (or Upper Data Latch) for storing two bits of data RESET is always at the beginning of the processor operations. Steps can be skipped according to the need of the operations.)

1) The common processor reading data from the sense amplifier:

Sense amplifier's data will be fetched out of SA latch 214-1 and latched into PLatch 520 through SBUS 422 and input logic 510. Platch could flip MTCH 524 from "1" to "0" as controlled by the control signals.

2) The common processor reading data from the first of the data latches:

Data in DL1 of data latches 430-1 will be fetched from DBUS 423 going through input logic 510, and latched into PLatch 520. Platch could flip MTCH from "1" to "0". If MTCH=0 from step 1), then MTCH will stay at 0 for the rest of steps.

3) The common processor reading data from the second of the data latches:

Data in DL2 of data latches will be fetched from DBUS going through input logic 510, and latched into PLatch. Platch could flip MTCH from "1" to "0". If MTCH=0 from step 1), then MTCH will stay at 0 for the rest of steps. (Similarly, if there are more than two data latches with data, successive latches can be read.)

4) The common processor writing data to various latches:

The PLatch data can be used in one of three ways:

a. PLatch's data MTCH/MTCH* will be used to drive DBUS to update DL2 of the data latches.

b. PLatch's data MTCH/MTCH* will be used to drive SBUS to change the data in SA Latch 214-1.

c. PLatch's data MTCH/MTCH* will be used to drive the FLAG BUS to indicate the status of any error condition outside the read/write stack.

5) PLatch's result MTCH/MTCH* will be used to drive DBUS to update DL1 of the data latches.

Figure 14:
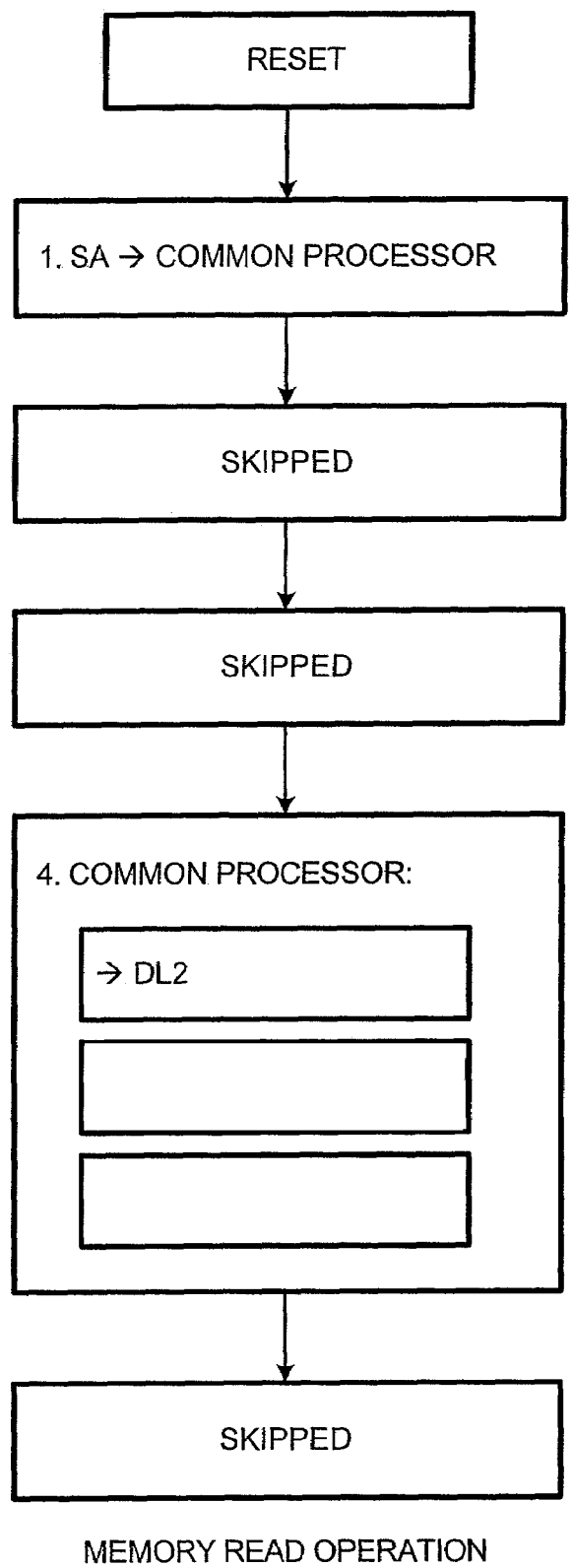
FIG. 14 illustrates an example of read operation by the common processor.

FIG. 14 illustrates an example of read operation by the common processor.

Reset
1) SA to PROCESSOR
2) Skipped
3) Skipped
4) PROCESSOR to DL2
5) Skipped

The sensing information is transferred to DL2.

Figure 15:
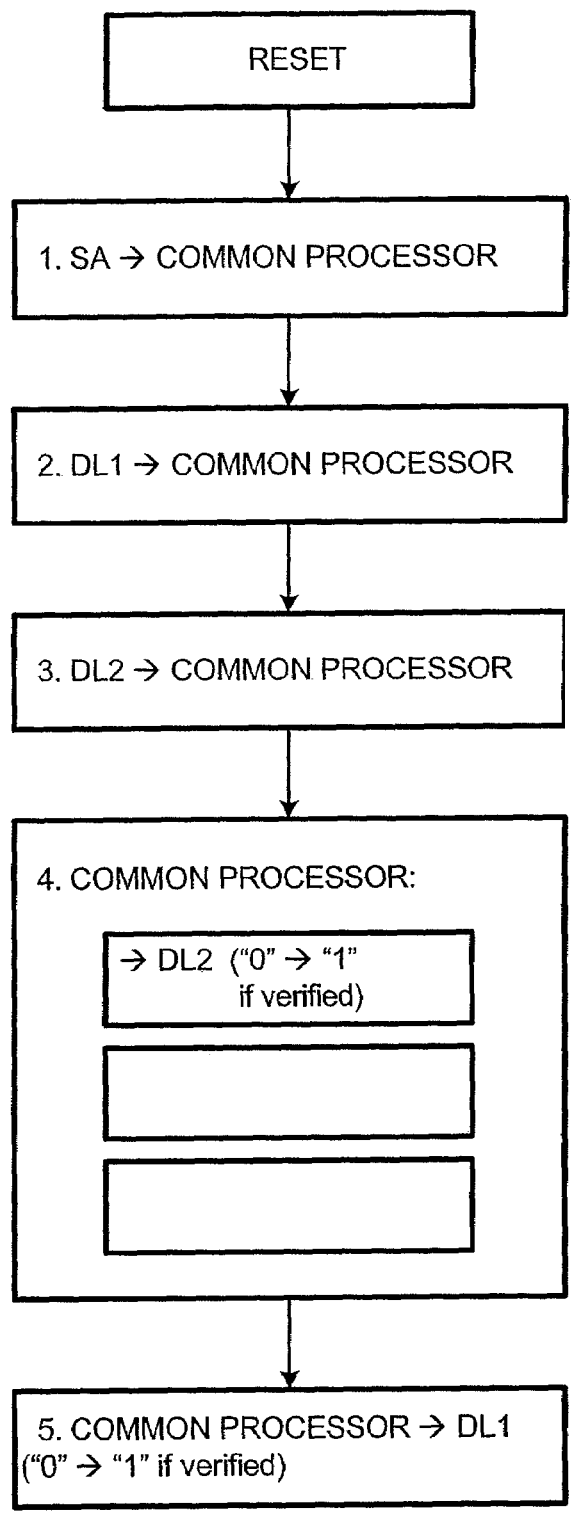
FIG. 15 illustrates an example of program verify (2 bits program) by the common processor.

FIG. 15 illustrates an example of program verify (2 bits program) by the common processor:

Reset
1) SA to PROCESSOR
2) DL1 to PROCESSOR
3) DL2 to PROCESSOR
4) PROCESSOR to DL2

Need to have program lockout if the verify passed, and therefore data to DL2 will be changed from "0" to "1" to enforce no programming.

5) PROCESSOR to DL1

Need to have program lockout if the verify passed, and data to DL1 will be changed from "0" to "1" to enforce no programming.

Figure 16:
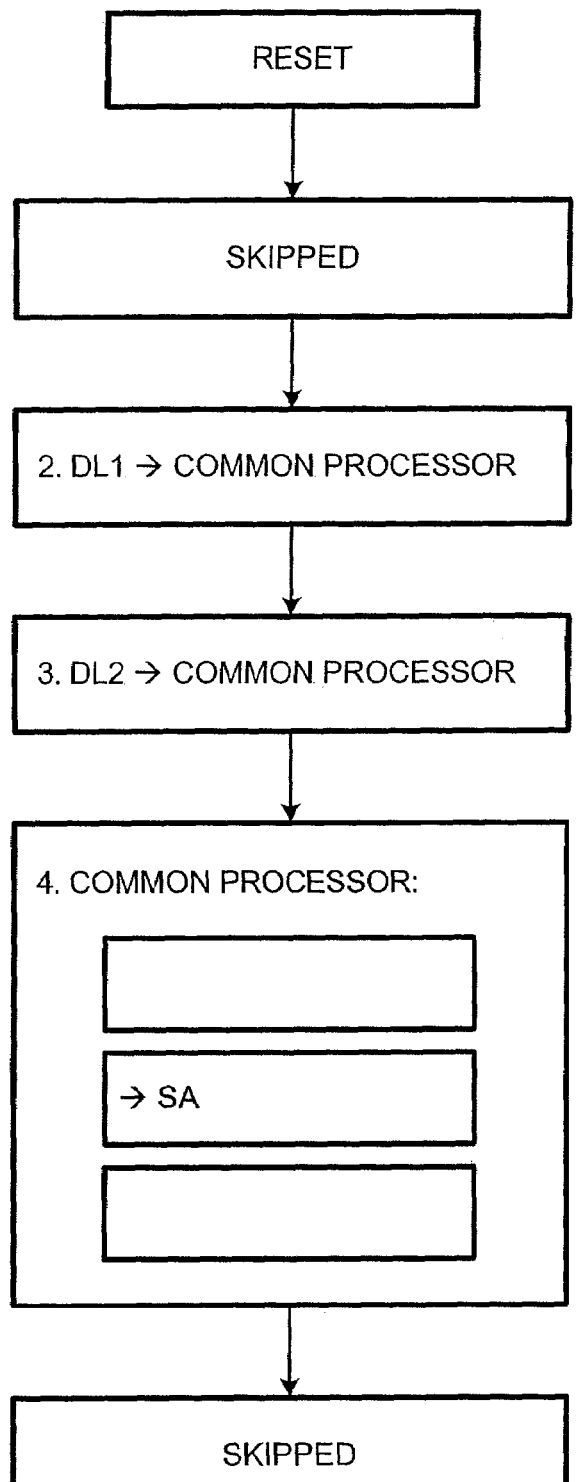
FIG. 16 illustrates an example of program inhibit (2 bits program) by the common processor.

FIG. 16 illustrates an example of program inhibit (2 bits program) by the common processor:

Reset
1) Skipped
2) DL1 to PROCESSOR
3) DL2 to PROCESSOR
4) PROCESSOR to SA
5) Skipped Step 2) and 3) will ONLY match the data "11". If it is "11" data, then step 4) will make the SA to be "1" data for program inhibit.

Figure 17:
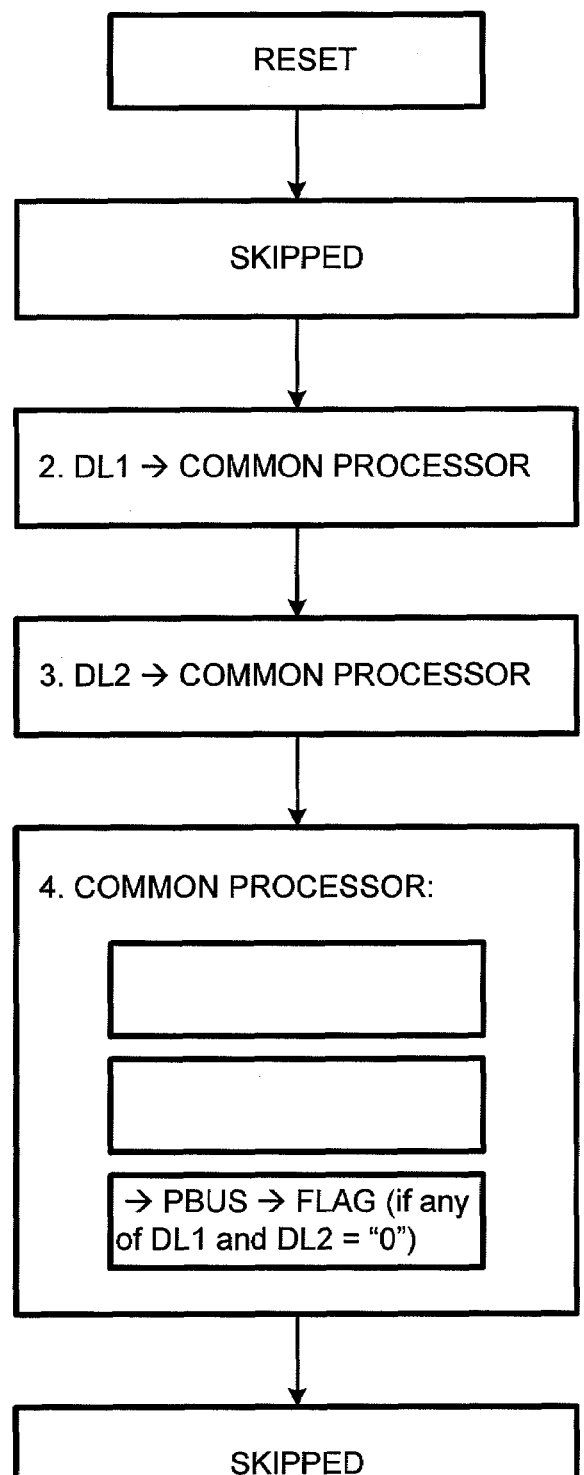
FIG. 17 illustrates an example of error detection (2 bits program) by the common processor.

FIG. 17 illustrates an example of error detection (2 bits program) by the common processor:

Reset
1) Skipped
2) DL1 to PROCESSOR
3) DL2 to PROCESSOR
4) PROCESSOR to PBUS to FLAG BUS
5) Skipped Step 2) and 3) will check if any data is "0". If there is, then the PBUS will be pulled to "1". This in turn will drive the gate of the n-transistor 550 to pull down the FLAG BUS 509 (see FIG. 9).

The basic functional steps illustrated in FIG. 13 also include some auxiliary in-between steps and considerations:

1) Precharge of the DBUS or SBUS by the common processor.

The DBUS interconnecting the common processor and the data latches is precharged to Vdd by virtue of being connected to the PBUS, which is precharged to Vdd by the common processor. The DBUS is normally precharged to Vdd (or logic state "1"). When reading a Data Latch (DL), if the DL has the data of "1", the DBUS will remain at "1", otherwise a data "0" at DL will drive the DBUS to GND.

As can be seen from the truth table in FIG. 12B, the DBUS is precharged to Vdd by the processor driver (output logic 530) with the control signals settings of PDIR=0 and PINV=0, regardless of the value MTCH and MTCH*. The Precharge DBUS to Vdd cycle is inserted before every cycle of DL2 to PROCESSOR, or DL1 to PROCESSOR.

The cycle to fetch the data from the SA latch also involves charging the SBUS to Vdd by the processor driver. Similar to the data latches case, when reading the SA Latch, if it has the data of "1", the SBUS will remain at "1", otherwise a data "0" at the SA Latch will drive the SBUS to GND.

2) Precharge of DBUS with the Data Latches, such as DL1 and DL2.

For the PROCESSOR to DL1 or PROCESSOR to DL2 cycle, the DBUS is precharged by the data in the data latch (DL) to prevent flipping the Data Latches, the PROCESSOR output (i.e., PBUS) is floated at HiZ.

Also, HiZ on DBUS is needed for program verify sequence. Whenever the data fail to verify, program data at the Data Latches would be kept unchanged.

Figure 18:
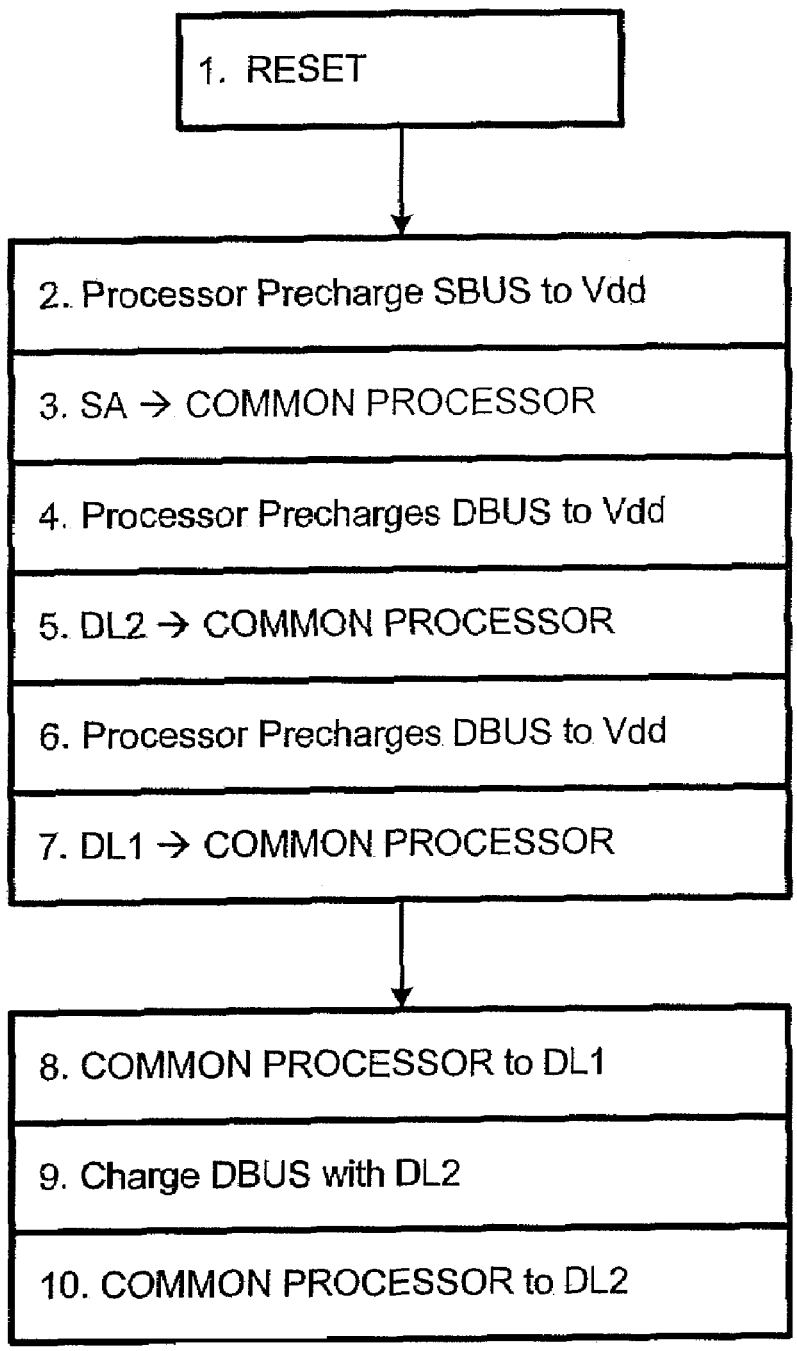
FIG. 18 illustrates the full cycle of in including the auxiliary steps into the basic steps of FIG. 13 for transferring data from the sense amplifier to the data latches.

FIG. 18 illustrates the full cycle of in including the auxiliary steps into the basic steps of FIG. 13 for transferring data from the sense amplifier to the data latches.

1. RESET
2. Precharge SBUS to Vdd from PROCESSOR;
3. Transfer SA to PROCESSOR;
4. Precharge DBUS to Vdd;
5. DL2 to PROCESSOR;
6. Precharge DBUS to Vdd;
7. DL1 to PROCESSOR;
8. PROCESSOR to DL1 (since step 7 already has updated data on DBUS, so PROCESSOR can update DL1 directly)
9. Charge DBUS with DL2;
10. PROCESSOR to DL2.

Although the various aspects of the present invention have been described with respect to certain embodiments, it is understood that the invention is entitled to protection within the full scope of the appended claims.

What is claimed is:

1. A non-volatile memory device, comprising:
   an array of memory cells;
   a plurality of read/write stacks for operating on a group of memory cells of said array in parallel,
   each read/write stack comprising:
   a stack of sense amplifiers;
   a set of data latches associated with each sense amplifier;
   a processor for processing data between any one of the stack of sense amplifiers and the associated set of data latches; and wherein said processor further comprising:
   an input logic selectively coupled to either a selected sense amplifiers or the associated set of data latches to retrieve data therefrom, said input logic responsive to the retrieved data and a first set of control signals to generate first resultant data;
   a processor latch coupled to store the first resultant data; and
   an output logic coupled to the processor latch to receive the first resultant data and responsive to a second set of control signals to generate second resultant data, said processor selectively coupled to either the selected sense amplifier or the set of data latches to store said second resultant data thereto.

2. A non-volatile memory device as in claim 1, wherein each sense amplifier further comprises a sense amplifier latch for storing sense amplifier data.

3. A non-volatile memory device as in claim 1, wherein the processor latch is a set/reset latch.

4. A non-volatile memory device as in claim 1, wherein said processor is shared by a plurality of read/write stacks.

5. A non-volatile memory device as in claim 1, further comprising:
   a controller for generating said first and second set of control signals.

6. A non-volatile memory device as in claim 1, wherein said second resultant data from said processor is latched by the associated set of data latches.

7. A non-volatile memory device as in claim 1, wherein said second resultant data from said processor is stored in the sense amplifier latch of the selected sense amplifier.

8. A non-volatile memory device as in claim 1, wherein said processor retrieves data from the associated set of data latches.

9. A non-volatile memory device as in claim 1, wherein said processor retrieves data from the selected sense amplifier.

10. A non-volatile memory device as in claim 1, wherein said processor retrieves data from one portion of the associated set of data latches and stores said second resultant data to another portion of the associated set of data latches.

11. A non-volatile memory device as in claim 1, wherein said processor outputs a status responsive to a predetermined data condition.

12. A non-volatile memory device as in claim 1, wherein said output logic comprises:
    at least one pull-up circuit controlled by PMOS transistors.

13. A non-volatile memory device as in claim 1, wherein said output logic comprises:
    at least one pull-down circuit controlled by NMOS transistors.

14. A non-volatile memory device as in any one of claims 1-13, wherein each memory cell stores one bit of data.

15. A non-volatile memory device as in any one of claims 1-13, wherein each memory cell stores more than one bit of data.

16. A method of processing data for non-volatile memory among a set of sense amplifiers and data latches, comprising:
retrieving data from either one of said sense amplifiers or one of said data latches;
providing a processor having an input logic and an output logic;
generating a first resultant data by using the input logic to process the retrieved data according to a first set of control signals;
generating a second resultant data by using the output logic to process the first resultant data according to a second set of control signals;
storing the second resultant data to at least one of said set of sense amplifiers or one of said set of data latches.

17. The method of claim 16, wherein said non-volatile memory includes an array of memory cells and each memory cell stores one bit of data.

18. The method of claim 16, wherein said non-volatile memory includes an array of memory cells and each memory cell stores more than one bit of data.

* * * * *